US010761161B2

(12) United States Patent
Biber

(10) Patent No.: US 10,761,161 B2
(45) Date of Patent: Sep. 1, 2020

(54) MAGNETIC RESONANCE SYSTEM AND METHOD FOR CONTROLLING A POWER SUPPLY FOR A SUPERCONDUCTING COIL OF THE MAGNETIC RESONANCE SYSTEM

(71) Applicant: Siemens Healthcare GmbH, Erlangen (DE)

(72) Inventor: Stephan Biber, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 600 days.

(21) Appl. No.: 15/592,330

(22) Filed: May 11, 2017

(65) Prior Publication Data

US 2017/0328969 A1 Nov. 16, 2017

(30) Foreign Application Priority Data

May 11, 2016 (DE) .................. 10 2016 208 107

(51) Int. Cl.
| | |
|---|---|
| H02J 9/06 | (2006.01) |
| H02J 7/00 | (2006.01) |
| G06F 1/26 | (2006.01) |
| G01N 24/08 | (2006.01) |
| G01R 33/3815 | (2006.01) |
| G01R 33/54 | (2006.01) |

(52) U.S. Cl.
CPC ....... *G01R 33/3815* (2013.01); *G01R 33/546* (2013.01)

(58) Field of Classification Search
CPC ............ G01R 33/3692; G01R 33/3815; G01R 33/3856; G01R 33/34023; G01R 33/3403; H02J 9/061; H02J 9/062; H02J 9/068; H02J 9/06
See application file for complete search history.

(56) References Cited

U.S. PATENT DOCUMENTS

| | | | | |
|---|---|---|---|---|
| 9,082,535 B2* | 7/2015 | Blakes | ...................... | H01F 6/04 |
| 2005/0111159 A1 | 5/2005 | Knight | | |
| 2012/0182012 A1 | 7/2012 | Lvovsky et al. | | |
| 2012/0296197 A1* | 11/2012 | Vahala | ..................... | A61N 7/02 |
| | | | | 600/411 |

(Continued)

FOREIGN PATENT DOCUMENTS

| | | |
|---|---|---|
| DE | 19527150 A1 | 1/1997 |
| EP | 0151719 A2 | 8/1985 |

OTHER PUBLICATIONS

Chunyan, et al. "Research summary of superconducting switch" Superconductivity, Cryo. & Supercond., vol. 39, No. 10, pp. 33-39, (2011).

(Continued)

*Primary Examiner* — Alesa Allgood
(74) *Attorney, Agent, or Firm* — Schiff Hardin LLP

(57) ABSTRACT

A magnetic resonance (MR) apparatus has an MR scanner that includes a basic field magnet, which defines a patient receiving zone and that has at least one superconducting coil that generates a basic magnetic field in the MR scanner. The MR scanner has a power supply controlled by at least one control computer of the MR apparatus for the purpose of providing electrical power to the superconducting coil. The power supply is arranged on, and may be fixedly mounted to, the basic field magnet or integrated into the basic field magnet.

20 Claims, 2 Drawing Sheets

(56) References Cited

U.S. PATENT DOCUMENTS

| | | |
|---|---|---|
| 2013/0123109 A1 | 5/2013 | Harrison |
| 2013/0147485 A1 | 6/2013 | Yokoi |
| 2013/0184879 A1* | 7/2013 | Xia .................... H01J 13/0024 |
| | | 700/286 |
| 2014/0009151 A1* | 1/2014 | Van Helvoort .... G01R 33/3856 |
| | | 324/307 |
| 2014/0085021 A1 | 3/2014 | Blakes et al. |
| 2016/0091580 A1* | 3/2016 | Kreischer .......... G01R 33/3403 |
| | | 324/322 |
| 2016/0233011 A1 | 8/2016 | Eguchi |

OTHER PUBLICATIONS

Wang: "Device Technology Study of Medical Magnetic Resonance Imaging device (MRI)"; Medicine Technology Press of China; ISBN:978-7-5067-5062, Sep. 2011, and English language translation.

Chinese Action dated Apr. 2, 2020, for Application 201710329012.2, and English language translation.

* cited by examiner

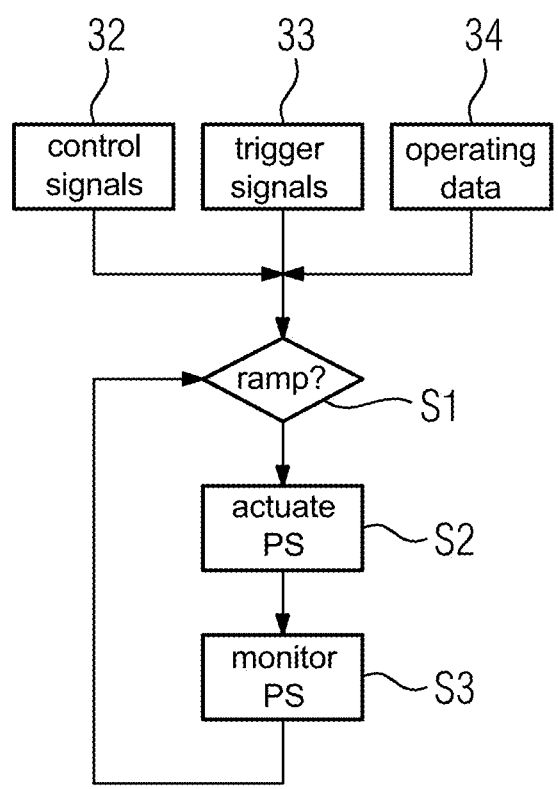

MAGNETIC RESONANCE SYSTEM AND METHOD FOR CONTROLLING A POWER SUPPLY FOR A SUPERCONDUCTING COIL OF THE MAGNETIC RESONANCE SYSTEM

BACKGROUND OF THE INVENTION

Field of the Invention

The invention concerns a magnetic resonance system having a magnetic resonance scanner that includes a basic field magnet that defines a patient receiving zone, having at least one superconducting coil that generates a basic magnetic field of the magnetic resonance scanner. The invention also concerns a method for controlling a power supply for such a superconducting coil in a magnetic resonance system of this type.

Description of the Prior Art

Magnetic resonance apparatuses, in particular for use in medical imaging, are widely known. They have a basic field magnet that, in the case of a "closed" magnetic resonance scanner, defines a cylindrical patient receiving zone. Inside the basic field magnet is at least one superconducting coil, the purpose of which is to generate the magnetic resonance scanner's basic magnetic field, which typically is extremely high, in the range of several tesla.

Since the magnetic resonance frequency, i.e. the Larmor frequency, is determined by the strength of the basic magnetic field, the electric current flowing through the superconducting coil must be adjusted to an extremely precise setting. Once this has been realized, however, the losses of the superconducting coils in use today are so insignificant that the superconducting coil can be operated for a long time, several years for example, without any appreciable further input or expenditure of energy.

In order to set the current flow in the superconducting coil, in other words to increase and decrease the current and thus to energize and deenergize ("ramp up" and "ramp down", respectively) the basic magnetic field, it is known to use a special power supply for the basic field magnet (MPSU—Magnet Power Supply Unit), which, since it is seldom required, is realized externally to the actual magnetic resonance scanner or apparatus as an auxiliary device for service engineers. In such an application, the power supply for the superconducting coil must be capable of supplying, i.e. generating, high currents, for example currents of several hundred amperes, with extreme precision, in which case it normally also includes a ferrite-based current measuring device for regulating and monitoring the current flow. This process of ramping up and ramping down the current flow through the superconducting coil, and hence the magnetic field, occupies a relatively long period of time in order to prevent an overheating of the superconducting coil, which is cooled by a suitable cooling device, and consequently to avoid an event known as a "quench". For example, a ramp-up or ramp-down of the current flow through the superconducting coil can take 30 to 200 minutes.

If it is now intended to carry out a service procedure on the magnetic resonance scanner, for example to exchange a cold head of the cooling device for the superconducting coil, a service engineer brings along the power supply for the superconducting coil as a service tool, connects it, and ramps down the current flow through the superconducting coil, and therefore the magnetic field, so that the cold head can be replaced. Following this, the magnetic field is ramped up again by increasing the current flow through the superconducting coil, and the power supply is removed again so that, as a cost-intensive device, it can be used on a number of magnetic resonance scanners or systems.

Future-generation magnet technologies focus on reducing the helium content in the cooling device in the basic field magnet to less than 200 liters, while some concepts even aim at realizing completely dry basic field magnets that dispense with the use of helium. In these concepts, the thermal buffer is significantly reduced, such that the remaining safe zone ("thermal margin") of today's superconductors will quickly be overcome in the event of a failure of the cooling device, thereby resulting in a collapse of the superconductivity, heat build-up, and in certain circumstances a quench. Permitting a quench in the magnetic resonance device, however, means that a significant increase in recovery time in order to use the magnetic resonance apparatus again will occur as soon as the function of the cooling device is restored. Due to the reduced thermal buffers in such systems, the time remaining will not be sufficient for a service engineer to arrive on site in order to ramp down the magnetic field in a controlled manner.

A further disadvantage of magnetic resonance scanners in use today is that when service activities are to be carried out, there is always a delay that arises due to waiting for the current flow through the superconducting coil to ramp up and ramp down, resulting in a considerable loss of time. Furthermore, the basic magnetic field of a modern magnetic resonance scanner essentially remains energized, which means, for example, that a cooling device for the superconducting coil also has to continue running at weekends, and cleaning staff in the shielded room for the magnetic resonance scanner require special instruction.

SUMMARY OF THE INVENTION

An object of the invention is to provide a magnetic resonance apparatus that is improved in terms of maintenance friendliness, and/or in the event of a small or even non-existent helium supply, is improved in terms of ease of operation.

This object is achieved according to the invention, in the case of a magnetic resonance system of the type cited in the introduction, by the magnetic resonance apparatus additionally having a power supply that can be controlled by at least one control computer of the magnetic resonance system for the purpose of providing electrical power to the superconducting coil, and that is structurally a part of the basic field magnet, by being arranged on, in particular fixedly mounted to, the basic field magnet, or integrated into the basic field magnet.

Therefore, according to the invention, the power supply for the superconducting coil is combined with the basic field magnet, whereas such a power supply was realized in the prior art as a service tool for use by service personnel. In accordance with the invention the power supply is close to the basic field magnet or even integrated therein, so cable paths, in particular for strong currents, can be kept short, thus simplifying the targeted provision of high-precision currents. The power supply provides such strong currents, in particular a current greater than 100 amperes and/or in the range of 400-700 amperes, and for that purpose may have a high-current generator. In this case the high-current generator may be embodied as a power pack that can be fed with a d.c. voltage, in particular in the range of 40 to 100 volts. The voltage can be generated outside of the shielded room of the magnetic resonance system by a dedicated voltage generator and supplied to the power supply unit at low amperage, for example with a current of less than 10 amperes. As well as the further power supply unit for further components of the magnetic resonance scanner apart from the superconducting coil, for example for a cooling device of the superconducting coil, as have been available to date in prior art magnetic resonance devices, an additional power supply fulfilling the specific requirements for the controlled and precise ramp-up and ramp-down of the current flow through the superconducting coil, and consequently of the basic magnetic field, is now also generally available in the magnetic resonance scanner and can be controlled by a control computer of the magnetic resonance apparatus. In practice, the control computer for controlling the power supply thus is designed to ramp up and/or ramp down the current flow through the superconducting coil. For this purpose, the power supply for the superconducting coil therefore has, in addition to the cited high-current generator (power pack), the typical, essentially known components that feed currents determined with extreme precision, albeit at low power, into the superconducting coil and that monitor this current, with a suitable current measuring device. In this case the current is provided to the superconducting coil preferably as a direct or galvanic current so that the exact setting is maintained during ramp-down and ramp-up.

In order to enable the power supply for the superconducting coil to be realized so that it has the minimum possible impact on imaging, further modifications in comparison with the known service tools of service personnel are necessary. Thus in an embodiment of the present invention, the power supply, in particular a current measuring device of the power supply unit, is ferrite-free. Conventional power supply units for superconducting coils that are carried as service equipment by service personnel are in most cases ferrite-based devices, in particularly the current measuring device thereof. There is a thus risk of a disturbance to the homogeneity of the basic magnetic field and/or other magnetic fields used for imaging in the homogeneity region, i.e. the imaging field of view. According to the invention a ferrite-free design of the power supply for the superconducting coil is achieved. For example, shunt resistors, which have become available with sufficient quality, may be used as a substitute for the ferrite-based components in the current measuring device. It should furthermore be noted that in principle the invention also allows the presence of components that are available at a more reasonable cost, yet which nonetheless satisfy the precision requirements for the power supply for the superconducting coil. Such components can enable a less expensive realization of the power supply for the superconducting coil, and consequently also a financially viable installation thereof in a magnetic resonance scanner, which did not appear possible hitherto. Moreover, the power supply can be realized in other respects with minimum use of magnetic materials, i.e. with a small proportion of magnetic materials, in order to reduce the magnetic attracting force of the power supply.

The magnetic resonance apparatus according to the invention affords a number of advantages. It now becomes possible for the first time, even in the case of future-generation magnetic resonance scanner that manage with less helium, or even totally do without helium, as coolant for the cooling device of the superconducting coil, to respond to potential trouble situations, in particular the failure of the cooling device or the power supply as a whole. This is because the magnetic resonance system itself is designed for automatically ramping down the current flow through the superconducting coil, and consequently the basic magnetic field, and if necessary ramping it up again when the trouble situation is resolved. Thus a quench can be avoided in the event of a malfunction of the cooling system, for example. The recovery time also is then significantly reduced, which is to be regarded as a key factor for the successful marketing of innovative concepts featuring a low percentage of helium or indeed dry magnet technologies in the field of clinical whole-body magnetic resonance imaging.

The availability of a power supply for the superconducting coil as a permanent part of the magnetic resonance scanner permits additional advantages, particularly with regard to servicing of the basic field magnet. Because of the control provided by the control computer, there is also the opportunity for a connection to external communication networks to be present, for example to a LAN or the Internet, which aspect will be discussed in greater depth in the following. In the case of a scheduled service activity such as the replacement of the cold head for the cooling device for the superconducting coil, for example, this permits a ramp-down of the magnetic field in advance, without the service personnel already being present. In this way there is no or a reduced waiting time for the service personnel. Furthermore, the present invention also permits energy for the cooling device for the superconducting coil to be saved if the magnetic field is ramped down, for example during periods in which the magnetic resonance system is not in use. It is also possible to create time windows without an active magnetic field, in which periods a cleaning of the magnetic resonance device takes place, for example, and/or training for personnel is carried out.

In practice the power supply itself has a communication interface for controlling the power supply remotely from the magnetic resonance scanner, and/or such a communication interface is provided indirectly by a control component of the control computer. This control component is installed in or on the basic field magnet. This means the actual control of the power supply can either be effected directly via a corresponding control line by components of the control computer that are situated outside of the shielded room, although it is more preferred according to the invention to support the integration in terms of a control component that is typically provided anyway in or on the basic field magnet, in order to forward control signals, if necessary following a conditioning step, to the power supply for the superconducting coil. Moreover, a control component of this type also distributes other control signals for other components of the magnetic resonance scanner, for example to the cooling device and the like.

Accordingly, the magnetic resonance apparatus can additionally have, as part of the control computer, a control arrangement provided externally to the shielded room accommodating the magnetic resonance scanner, with at least one control component of the control arrangement being designed for direct or indirect control of the power supply via the communication interface. In this case, as mentioned, control via the control component of the main magnet unit is preferred. The control arrangement, which is provided outside of the shielded room, typically includes further components that can be installed in an electronics cabinet or some other installation facility. The further components of the control arrangement may be, for example amplifiers for the gradient coils and/or the radiofrequency coils, various transformers and/or a computer. Corresponding control lines from the control arrangement to the magnetic resonance scanner, in particular to the control computer of the magnetic resonance scanner, are typically routed into the shielded room via a component called a filter plate, which filters out at least frequency components in the range of the magnetic resonance sequence. The filter plate has suitable filters for that purpose.

The control component may in this case be a central control component of the control arrangement, that converts control signals into proprietary protocols. Starting from a control component of this type, the corresponding control lines are routed centrally to the magnetic resonance scanner after the control signals have been converted into a suitable format, i.e. have been conditioned for the magnetic resonance scanner, in particular the control computer of the magnetic resonance scanner. Control signals that have been received by the control arrangement in a generally established standard protocol, via a communal LAN network for example, can then be converted by the central control component into a proprietary protocol of the magnetic resonance system. This applies in particular also to control signals for the power supply, which are received from an external source and can be converted into actual proprietary control commands.

In an embodiment of the invention, the control computer has an operator console having an input device that is connected to the control arrangement. In most cases a computer serves as such an operator console, which can be a commercially available PC and which has corresponding input devices in order to enable an operator-initiated control of the magnetic resonance apparatus. The connection to the control arrangement can in this case be implemented also via a communication network, in particular a LAN. A ramp-up or ramp-down of the current flow through the superconducting coil can therefore be initiated also via an operator console of this type.

In another embodiment of the magnetic resonance apparatus according to the invention, the apparatus additionally has an uninterruptible power supply for at least the control component and/or the control computer. With such an uninterruptible power supply (UPS), it is possible, even in the case of a power failure, which would then also affect the cooling device of the superconducting coil, to keep at least core components of the control device active, and consequently also to enable the basic magnetic field of the magnetic resonance apparatus to be ramped down in spite of a power failure. This is because the power supply can be controlled accordingly, in which event the power supply can likewise utilize electrical power of the uninterruptible power supply. In other words, in the event of a power failure being detected, the control computer is preferably designed to actuate the power supply in order to ramp down the current flow through the superconducting coil using electrical power of the uninterruptible power supply. In this way it is possible, for example, to avoid a quench even in the event of a total power failure. The uninterruptible power supply is preferably provided solely for the control component and/or the control computer and is therefore independent of further components of the magnetic resonance apparatus. It is thus not used to feed a ramp-up of the current in the superconducting coil. It can therefore be dimensioned sufficiently small and is customized to its main application case, namely to initiate a targeted ramp-down of the current in the superconducting coil even in the event of a power failure and consequently to avoid a quench. At the same time, however, energy is drawn from the superconducting coil, such as by a resistance, which may be in the form of a diode array or the like. When an uninterruptible power supply is used, it is furthermore beneficial for, as explained in greater detail below, a communication interface to remain active and a communication path into a communication network to also continues to exist, even when the uninterruptible power supply is employed. Thus messages relating to a "ramp up" or "ramp down" as well as the monitoring of a ramp operation continue to be possible.

It can also be generally provided within the scope of the invention for the control device to be designed to ramp down the current flow through the superconducting coil if an emergency criterion is fulfilled, in particular if a failure of a cooling device of the superconducting coil is detected, and/or to ramp up or ramp down the current flow through the superconducting coil if a control signal received via a communication interface of the control arrangement is present. Stated another way, the control device constantly checks whether a ramp-down criterion and a ramp-up criterion are fulfilled, and the ramp-down criterion is fulfilled if the emergency criterion is fulfilled as well as if a control signal indicating a ramp-down is present, and the ramp-up criterion is fulfilled if the emergency criterion ceases to be fulfilled and/or if a control signal indicating a ramp-up is present. It can therefore also be provided that if the emergency criterion ceases to be fulfilled, i.e. in particular upon the functionality of the cooling device being restored, an automatic ramp-up is initiated by the control computer so that the downtime is kept to a minimum.

It should also be noted that monitoring of the operation of the power supply for the superconducting coil can also take place by the control computer. Thus, the power supply is designed to determine at least one operating parameter characterizing its operation, and to transmit the operating parameter to the control computer. The operating parameter in this case can be a current through the power supply and/or a temperature of the power supply and/or the temperature of a cooling component of the power supply, in particular a passive cooling component. Because of the high currents, power supply of for superconducting coils, hence also the power supply inventively integrated into the magnetic resonance scanner, have cooling components that typically are designed as passive. If, for example, there now takes place in quick succession, possibly several times, a ramp-up or ramp-down of the current flow through the superconducting coil, an unduly severe heat buildup can occur, which can be monitored by corresponding operating parameters by the control computer or by an operator to whom the operating parameters are presented by the control computer. Accordingly, the control computer can be designed to influence the operation of the power supply and/or of the magnetic resonance scanner as a function of the operating parameters and/or to control at least one information output to an operator as a function of the operating parameters. For example, a slower ramp-up or ramp-down of the current flow, and hence of the basic magnetic field, can be effected if excessively high temperature values are measured, and/or the corrective adjustment of the current can also be influenced externally on the basis of the measured values of the current measuring device in the power supply. The information output to an operator is beneficial in many cases, at least at the time of a ramp-up or ramp-down operation.

In a further embodiment of the present invention, the control computer additionally has a programmable time switch device that transmits a control signal to the power supply for the purpose of ramping down or ramping up the current flow through the superconducting coil at programmed times. This means that the present invention also permits the realization of a "clock-controlled timer", which can be appropriately programmed to activate or deactivate the basic magnetic field at the programmed times. The time switch device can be programmed, for example, by an operator at the operator computing console, but also on the basis of externally provided programming signals. The time switch device therefore makes it possible to define regularly recurring time intervals, for example for cleaning and/or training purposes and/or in order to save energy, in particular at weekends, in which the current flow through the superconducting coil and therefore the basic magnetic field is ramped down and thus deactivated. An automatic power-up (ramp-up) is initiated again at the end of such time intervals. This therefore enables the operation of the superconducting coil to be controlled even when no operator is actually present.

The time switch device can be realized by hardware and/or software at various locations within the magnetic resonance apparatus, though it is preferred for the time switch device to be integrated into the basic field magnet and/or the control computer and/or the power supply. Thereby, a local control of the power supply for the superconducting coil is implemented, which is therefore protected also against a temporary breakdown in communication and/or failure of components of the control computer outside of the shielded room.

As already noted, it is furthermore beneficial for the magnetic resonance apparatus to have at least one network interface for connecting to a communication network, and the apparatus receives control signals for the power supply via the network interface as well as for controlling the power supply in accordance with the received control signals. As noted, control computers of conventional magnetic resonance apparatuses are in most cases connected to communication networks anyway via corresponding network interfaces, such as local communication networks, for example LANs, or to the Internet itself. In this way it is possible to perform an explicit remote control of the magnetic resonance apparatus with respect to the basic magnetic field, which means that control signals for the power supply for the superconducting coil can be received via the network interface from outside of the magnetic resonance apparatus and accordingly be used for controlling the power supply. It is therefore possible, for example, to perform a ramp-up and ramp-down of the current flow in the superconducting coil in a targeted manner from a computer associated with a manufacturer and/or a service provider and/or to program the time switch device. This enables significant time savings to be achieved, particularly with regard to service, since a service engineer will come on site when the basic field magnet has already been deactivated and the ramp-up does not have to be monitored. For example, given an installed base of 10,000 systems and cold head replacement at two-year intervals, up to 5000 working days can be saved per annum.

In addition to the magnetic resonance apparatus, the present invention also concerns to a method for controlling a power supply for a superconducting coil in a magnetic resonance apparatus according to the invention. In this method, the control computer actuates the power supply in order to ramp up the current flow through the superconducting coil when a ramp-up criterion is fulfilled, and in order to ramp down the current flow through the superconducting coil when a ramp-down criterion is fulfilled. All statements made in relation to the magnetic resonance apparatus according to the invention apply to the method according to the invention, by which the cited advantages can therefore also be maintained.

In another embodiment of the method according to the invention, a control signal for the power supply and/or a programming signal for programming a time switch device for the power supply is transmitted, via at least one communication network, by a computer external to the magnetic resonance apparatus, such as a computer associated with a manufacturer and/or a service provider. The ramp-down criterion is fulfilled in the case of the control signal indicating a desired ramp-down and the ramp-up criterion is fulfilled in the case of the control signal indicating a desired ramp-up. In the case of a programming signal, the time switch device is programmed accordingly by the control component. The programming signal therefore contains at least one point in time and an action that is to be performed at that point in time. The action can be ramp-up of the current flow through the superconducting coil, or ramp-down of the current flow through the superconducting coil. The programming signal for the time switch device can also include a regular repetition of a time interval in which the current flow through the superconducting coil is to be ramped down to zero. The advantages described in relation to the magnetic resonance apparatus can be achieved in this way, particularly with regard to service activities, such as a cold head replacement.

The inventive method and the inventive magnetic resonance apparatus therefore enable a remote control starting from an operator console, or starting from a computer associated with a manufacturer and/or a service provider, in particular via the internet. The arrival of service personnel for maintenance purposes, for example in order to replace the cooling head of the cooling device of the superconducting coil, can be suitably prepared for, thereby avoiding unnecessary waiting times for the service personnel. Moreover, work schedules, such as for cleaning and/or for training purposes, can be defined for other personnel at times in which the basic magnetic field is not active.

It should be noted that an emergency criterion can also determine the fulfillment of the ramp-down criterion or the ramp-up criterion, as has been explained with respect to the magnetic resonance apparatus.

In a further embodiment of the method according to the invention, the power supply determines at least one operating parameter characterizing its operation and transmits the parameter to the computer via the control component at the start of, during or immediately after the performance of an action described by a control signal or a programming signal. Monitoring of the operation of the power supply for the superconducting coil is therefore made possible in this way. The operating parameter may be a current through the power supply and/or a temperature of the power supply unit and/or a cooling component of the power supply, such as a passive cooling component.

It is furthermore beneficial, as explained, if a LAN and/or the internet are/is used as the communication network. In this way it is also possible for control measures or programming measures to be performed from a much greater distance from the magnetic resonance device or the magnetic resonance system.

BRIEF DESCRIPTION OF THE DRAWINGS

FIG. 2 is a flowchart of an exemplary embodiment of the method according to the invention.

DESCRIPTION OF THE PREFERRED EMBODIMENTS

Figure 1:
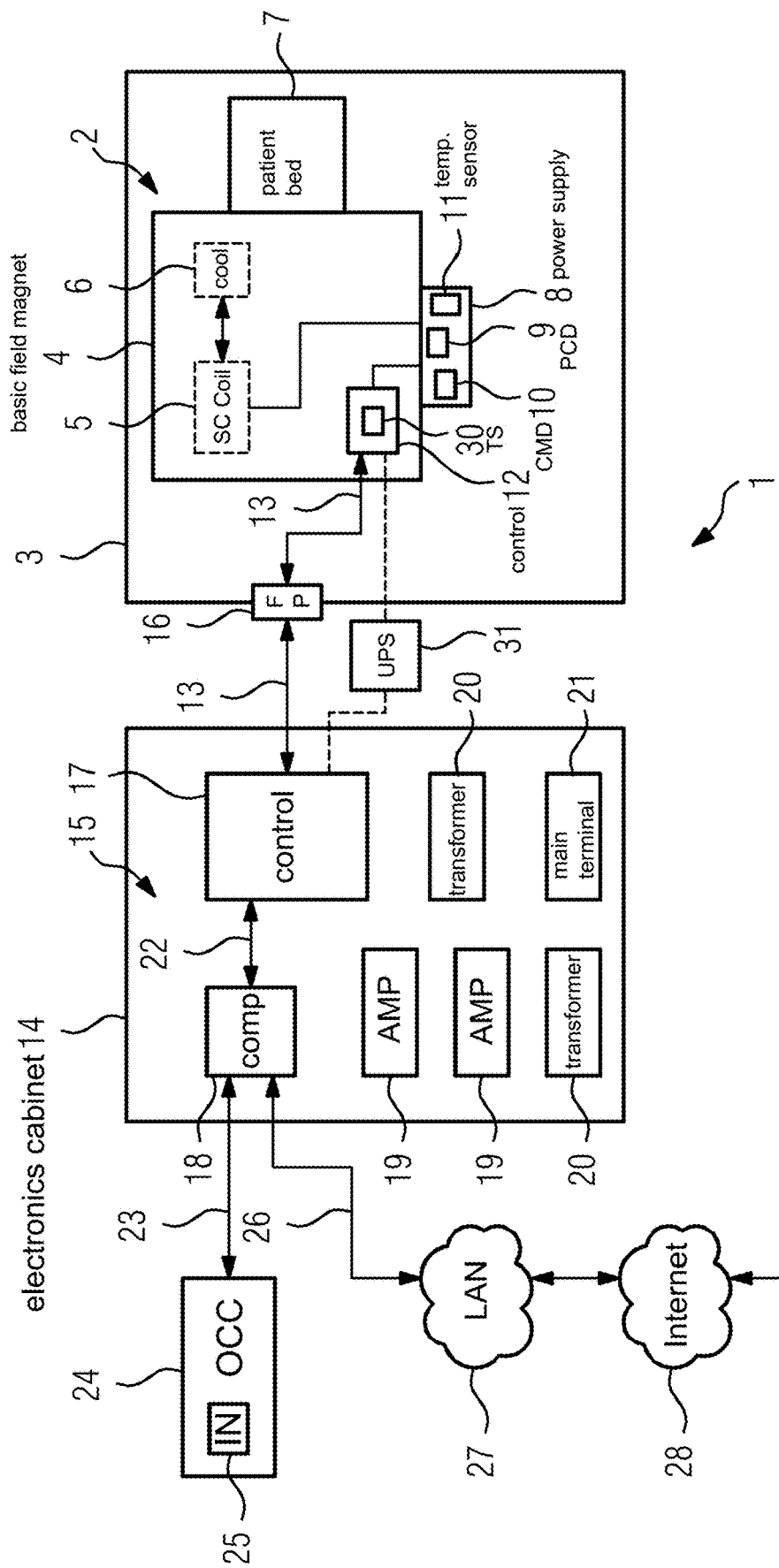
FIG. 1 schematically illustrates a magnetic resonance apparatus according to the invention.

FIG. 1 is a schematic illustration of components of a magnetic resonance apparatus 1 according to the invention as well as components communicating with the apparatus. The magnetic resonance apparatus 1 has, as is generally known, a magnetic resonance scanner 2 situated within a shielded room 3. The magnetic resonance scanner 2 has a basic field magnet 4 in which at least one superconducting coil 5 for generating the basic magnetic field of the magnetic resonance scanner 2 is arranged. The superconducting coil 5 has a cooling device 6, possibly operating with helium as the coolant. In this case the cooling device 6 can be realized with a reduced volume of helium compared to conventional cooling devices or can even do without helium altogether.

The circumferentially running windings of the superconducting coil 5 serve to define a cylindrical patient receiving zone (not shown in further detail) into which a patient can be introduced by a patient bed 7 for the purpose of magnetic resonance imaging.

In addition to a further power supply (not shown) the magnetic resonance scanner 2 has, fixedly mounted on the basic field magnet unit 4, a power supply 8 for the superconducting coil 5, via which it is possible, when the power supply 8 is actuated accordingly, to increase (ramp up) and also decrease again (ramp down) the current flow through the superconducting coil 5 and consequently the basic magnetic field. In order for the designated value for the basic magnetic field, and therefore the designated magnetic resonance frequency, to be set exactly, the currents supplied by the power supply 8 and provided in it by a high-current generator embodied as a power pack must be set exactly. Such currents can amount to several hundred amperes, with cooling being additionally provided by passive cooling components 9. A direct-current feed voltage can be generated outside of the shielded room 3 by a voltage generator and conducted to the power supply 8 at low current levels so as to avoid high currents in the shielded room. The voltage generator is not equivalent to a power amplifier for gradient coils, which would be significantly overdimensioned. In order to monitor the operation of the power supply 8, the power supply 8 has a current measuring device 10 and a temperature sensor 11, which supply the current through the power supply 8 and the temperature of the passive cooling components 9 as operating parameters, which can also be passed on to a control computer (still to be discussed) of the magnetic resonance apparatus 1 as well as, where necessary, to external computers.

In order to minimize the effect on the magnetic resonance imaging within the shielded room 3 and particularly within the homogeneity volume of the magnetic resonance scanner 2, the entire power supply 8 is implemented as ferrite-free, which applies as well to the current measuring device 10, which makes use of shunt resistors.

The power supply 8, which may also be realized as part of the basic field magnet 4, i.e. integrated into the magnetic resonance scanner 2, can be actuated accordingly by the control computer of the magnetic resonance apparatus 1, which has a variety of components. Generally it may be said that the control computer of the magnetic resonance apparatus 1 actuates the power supply 8 in order to ramp down the current flow through the superconducting coil 5 when a ramp-down criterion is fulfilled, and to ramp up the current flow through the superconducting coil 5 when a ramp-up criterion is fulfilled.

The actuation is effected in this case by a control component 12 as a component of the control computer, which is provided on or in the basic field magnet 4 of the magnetic resonance scanner 2 and can also actuate other components of the scanner 2, for example the cooling device 6 and/or the patient bed 7, in their operation. The control component 12 receives its corresponding control signals via a communication link 13 to a control arrangement 15 of the control computer of the magnetic resonance apparatus 1 provided inside an electronics cabinet 14, the electronics cabinet 14 being provided outside of the shielded room 3 and therefore, as is generally known, a filter plate 16 being used in order to remove frequency bands, in particular around the magnetic resonance frequency, disrupting the magnetic resonance imaging or the processing by the control arrangement 15. A communication interface allowing external control of the power supply 8 is therefore created by the communication link 13 (and the control computer 12).

The control component 12 receives its control signals from a central control component 17 of the control arrangement 15 which translates, and therefore conditions, the control signals into proprietary protocols. It should be noted that an embodiment is also conceivable in which the power supply 8 receives its control signals directly from the control component 17.

The control arrangement 15 also includes further components, a computer 18, amplifiers 19 for a gradient coil array (not shown in further detail) of the magnetic resonance scanner 2 and a radiofrequency coil array (not shown in further detail) of the magnetic resonance scanner 2, transformers 20 and a main terminal 21 being shown as an example. The communication of the control component 17 with the outside world is implemented in this case by the computer 18, as is indicated by the arrow 22. The computer 18 is connected via a LAN connection 23 to an operator computing console 24 also belonging to the magnetic resonance apparatus 1, and consequently to the control device of the magnetic resonance apparatus 1. Via the operator computing console 24, an operator is able in person to exercise control locally, i.e. in particular within the institution using the magnetic resonance apparatus 1, over various components of the magnetic resonance apparatus 1, in particular also the power supply 8, for which purpose the operator computing console 24 of course has a corresponding input device 25.

In the present case, however, the computer 18 also provides a network interface 26, which permits a connection into a local communication network 27 (LAN) and, via the internet 28 as global communication network, also to a computing device 29 at the manufacturer and/or service provider end. It is also possible to use the computing device 29 associated with the manufacturer or service provider to implement a remote control of the components of the magnetic resonance apparatus 1, i.e. in particular also of the power supply 8, which in the reverse case can in turn transmit operating parameters for monitoring its activity by way of the control device of the magnetic resonance apparatus 1 to the outside, i.e. in particular to the operator computing console 24 or the computing device 29, where a corresponding information output is also to take place. It should be noted that operating parameters of the power supply 8 may also be employed within the control device of the magnetic resonance apparatus 1 itself in order to generate corresponding control signals for optimizing the operation of the power supply 8, for example to ramp more slowly if there is an imminent risk of overheating and the like. This means that the power supply 8 integrated in the magnetic resonance device 2 is also fully integrated into the control operation of the magnetic resonance apparatus 1.

Also provided on the part of the magnetic resonance apparatus 1 is furthermore a time switch device 30, which in the present case is realized within the control unit 12, but may also be realized by corresponding hardware and software components at some other location, though preferably in the basic field magnet 4 and/or the power supply 8. By way of the programmable time switch device 30 it is possible to pre-program times at which the power supply 8 is actuated in order to ramp up or ramp down the current flow through the superconducting coil 5 and consequently the basic magnetic field. The time switch device 30 is programmed by programming signals generated by the operator computing console 24 and/or of the computing device 29 on the basis of operator inputs, which programming signals are used accordingly by the control device of the magnetic resonance apparatus 1 in order to perform the programming. A programming signal therefore designates at least point in time and an action that is to be performed at that point in time. It is also possible for regularly recurring times, for example a ramp-down of the basic magnetic field every weekend, to be programmed.

Control signals for ramping up or ramping down the basic magnetic field can therefore be generated both by the operator computing console 24 and by the computing device 29 at the manufacturer or service provider end, the corresponding criterion, i.e. the ramp-down criterion or the ramp-up criterion, being fulfilled when the control signals are present; programming signals which are responsible for a corresponding programming of the time switch device 30 may additionally be generated there. Once a programmed time for a ramp-up or ramp-down is reached, the ramp-up criterion or ramp-down criterion is also fulfilled accordingly.

However, the fulfillment of the ramp-up criterion or in particular of the ramp-down criterion can also be determined based on emergency criteria that are monitored on the part of the control device of the magnetic resonance apparatus 1. For example, it can be checked within the scope of an emergency criterion whether the cooling device 6 is operational or not and/or even whether a total power failure is present. In order to enable an emergency criterion of said type, the magnetic resonance apparatus 1 furthermore has in addition an uninterruptible power supply 31, which maintains at least the control component 17 and the control unit 12 in operation even in the event of a total power failure. The electrical energy stored in the uninterruptible power supply or electrical energy provided by the latter is preferably also sufficient to enable—ultimately, therefore, to initiate (which is sufficient)—a full ramp-down operation by way of the power supply 8. A ramp-up is not necessary for the specific application scenario, so the uninterruptible power supply 31 can remain a small-dimensioned unit.

FIG. 2 shows a flowchart of an exemplary embodiment of the method according to the invention.

In a step S1, the control device of the magnetic resonance apparatus 1 continuously monitors for the possible occurrence of a ramp-up criterion when the basic magnetic field is deactivated and for the possible occurrence of a ramp-down criterion when the basic magnetic field is activated. The input data evaluated for this purpose comprises control signals 32, which can originate, for example, from one of the computing devices 24 and/or 29, trigger signals 33 of the time switch device 30 and also operating data 34 of the magnetic resonance system in order for example to enable a check to be made for the occurrence of an emergency criterion or whether an emergency criterion has ceased to be fulfilled.

If the ramp-up criterion or ramp-down criterion is fulfilled in step S1, in a step S2, the control device of the magnetic resonance system 1 actuates the power supply unit 8 accordingly in order to ramp down or ramp up the current flow through the superconducting coil 5 such that the basic magnetic field is deactivated or activated for a corresponding period of time. During this time, as indicated by step S3, a constant monitoring of the activity of the power supply 8 based on the evaluation of its operating parameters can take place on the part of the control device of the magnetic resonance system 1. An information output in relation to the operating parameters of the power supply 8 for the superconducting coil 5 can also be generated by the operator computing console 24 or the computing device 29. Once the ramp-down or ramp-up operation has been successfully terminated, the corresponding other criterion is monitored in step S1.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance (MR) apparatus comprising:
   an MR data acquisition scanner comprising a basic field magnet that defines a patient receiving zone in said MR data acquisition scanner, said basic field magnet comprising at least one superconducting coil that generates a basic magnetic field in the MR data acquisition scanner;
   said MR data acquisition scanner comprising a power supply that is structurally combined in the MR data acquisition scanner by being situated on or integrated into said basic field magnet, said power supply being electrically connected to said superconducting coil;
   a computer configured to operate the power supply to selectively provide electrical power to said superconducting coil; and
   an uninterruptible power supply configured to provide electrical power at least to said computer,
   wherein said computer is further configured to, upon occurrence of a power failure being detected by said computer, control said power supply to ramp down a current flow through the at least one superconducting coil, using the electrical power of said uninterruptible power supply.

2. An MR apparatus as claimed in claim 1 wherein said power supply is fixedly mounted to said least one superconducting coil.

3. An MR apparatus as claimed in claim 1 wherein said power supply comprises a shunt resistor.

4. An MR system as claimed in claim 1 comprising a programmable time switch configured to transmit a control signal to said power supply in order to ramp down or ramp up a current flow through the least one superconducting coil at programmed times.

5. An MR apparatus as claimed in claim 1 wherein said computer comprises a network interface configured to place said computer in connection with a communication network in order to receive control signals for the power supply via the network interface, and wherein said computer is configured to control the power supply dependent on the control signals received via the network interface.

6. An MR apparatus as claimed in claim 1 wherein said power supply comprises a high-current generator that provides a galvanic current of greater than 100 A to said least one superconducting coil.

7. MR apparatus as claimed in claim 6 wherein said high-current generator is a power pack.

8. An MR apparatus as claimed in claim 1 wherein said power supply comprises a communication interface to said computer in order to receive control signals from said computer that control said power supply, said communication interface being selected from the group consisting of a communication interface combined with said power supply in a unitary structure, and a communication interface that is separate from said power supply, but is in communication with said power supply, and is mounted on or in said basic field magnet.

9. An MR apparatus as claimed in claim 8 wherein said MR data acquisition scanner is installed in a shielded room, and wherein said computer is situated outside of said shielded room.

10. An MR apparatus as claimed in claim 9 wherein said computer is configured to convert control signals for said power supply into proprietary protocols.

11. An MR apparatus as claimed in claim 9 comprising an operator control console having an input device that communicates with said computer.

12. An MR apparatus as claimed in claim 8 wherein said computer is configured to perform at least one of a ramp down of current flow through said least one superconducting coil if an emergency criterion is fulfilled, and to ramp up or ramp down the current flow through the least one superconducting coil dependent on a control signal received via said communication interface.

13. An MR apparatus as claimed in claim 12 wherein said programmable time switch is integrated into one of said basic field magnet, said control unit, or said power supply.

14. A method for controlling a power supply for a superconducting coil of a basic field magnet of a magnetic resonance (MR) scanner, wherein the power supply is structurally combined in the MR data acquisition scanner with the basic field magnet, said method comprising:
   from a computer in communication with said power supply, operating the power supply in order to ramp up current through the superconducting coil when a ramp-up criterion is fulfilled; and
   from said computer, ramping down the current flow through the superconducting coil when a ramp-down criterion is fulfilled, wherein, upon occurrence of a power failure detected by said computer, controlling said power supply, by said computer and using electrical power of an uninterruptible power supply, to ramp down the current flow through the superconducting coil.

15. A method as claimed in claim 14 wherein said ramp-up criterion or said ramp-down criterion is provided via a time switch at at least one programmed time.

16. A method as claimed in claim 14 comprising transmitting at least one operating parameter from said power supply, which characterizes operation of said power supply, to said computer.

17. A method as claimed in claim 14 comprising providing said control computer with control signals for said power supply via a source selected from a LAN and the Internet.

18. A method as claimed in claim 14 wherein at least one of said ramp-up criterion or said ramp-down criterion is provided by an external computing device situated at a source remote from an installation site of the MR data acquisition scanner.

19. A method as claimed in claim 18 wherein said power supply transmits said at least one operating parameter after performance of a predetermined action prescribed to said power supply by a control signal.

20. A magnetic resonance (MR) apparatus comprising:
   an MR data acquisition scanner comprising a basic field magnet that defines a patient receiving zone in said MR data acquisition scanner, said basic field magnet comprising at least one superconducting coil that generates a basic magnetic field in the MR data acquisition scanner;
   said MR data acquisition scanner comprising a power supply that is structurally combined in the MR data acquisition scanner by being situated on or integrated into said basic field magnet, said power supply being electrically connected to said superconducting coil and including a high-current generator that provides a galvanic current of greater than 100 A to said superconducting coil, wherein said high-current generator is a power pack; and
   a computer configured to operate the power supply to selectively provide electrical power to said superconducting coil.

* * * * *